United States Patent [19]

Akao et al.

[11] Patent Number: 5,041,879
[45] Date of Patent: Aug. 20, 1991

[54] SHEET SUPPLYING DEVICE HAVING CONTROL UNIT FOR SHEET SUPPLYING OPERATION

[75] Inventors: Michitoshi Akao, Nagoya; Kenji Sakakibara, Ichinomiya; Hideo Yoshihara, Kasugai; Takayuki Hayashi, Nagoya; Takashi Nakata, Nagoya; Hiroaki Kimura, Nagoya, all of Japan

[73] Assignee: Brother Kogyo Kabushiki Kaisha, Nagoya, Japan

[21] Appl. No.: 472,183

[22] Filed: Jan. 30, 1990

[30] Foreign Application Priority Data

| Jan. 30, 1989 | [JP] | Japan | 1-10348[U] |
| Jan. 30, 1989 | [JP] | Japan | 1-10349[U] |
| Jan. 30, 1989 | [JP] | Japan | 1-10350[U] |
| Jan. 30, 1989 | [JP] | Japan | 1-10356[U] |
| Jan. 30, 1989 | [JP] | Japan | 1-20512 |

[51] Int. Cl.$^5$ ............................................ G03G 21/00
[52] U.S. Cl. ............................................ 355/312; 271/11; 271/107; 271/256; 355/204; 355/308; 355/309
[58] Field of Search .................. 355/312, 27, 316, 317, 355/204, 206, 208, 209, 309, 308; 271/107, 11, 256, 258, 262

[56] References Cited

U.S. PATENT DOCUMENTS

| 4,017,175 | 4/1977 | Washio et al. | 355/206 |
| 4,589,649 | 5/1986 | Prescher | 271/107 |
| 4,627,771 | 12/1986 | Schron | 355/208 |
| 4,804,998 | 2/1989 | Miyawaki | 271/258 X |
| 4,821,070 | 4/1989 | Nakade et al. | 355/206 |
| 4,848,764 | 7/1989 | Tajima et al. | 271/107 X |
| 4,924,255 | 5/1990 | Horaguchi et al. | 355/27 |
| 4,928,949 | 5/1990 | Ramsey et al. | 271/258 X |
| 4,940,221 | 7/1990 | Wirz et al. | 271/107 |

Primary Examiner—A. T. Grimley
Assistant Examiner—Sandra L. Hoffman
Attorney, Agent, or Firm—Oliff & Berridge

[57] ABSTRACT

A sheet supplying device for supplying an uppermost sheet of a stack of sheets in a sheet cassette used in an image forming apparatus includes suction cups movable into and out of contact with the uppermost sheet in the sheet cassette, an evacuator for developing a vacuum in the suction cups to enable the suction cups to attract the uppermost sheet, a moving member for upwardly and downwardly moving the suction cups to pick up the sheet from the sheet cassette, a sheet feeding member for feeding the sheet from the moving member along a sheet feed path, and a control system for judging on the basis of a detection signal from each sensor for detecting an image forming error provided in the image forming apparatus whether the error occurs during the sheet supplying operation, and when judging that the image forming error occurs during a sheet supplying operation, the control unit ceasing the sheet supplying operation and controlling the driving of at least one of the suction cups, the evacuator, moving member and the sheet feeding member so that at least one of those members carries out a predetermined operation selected from the series of operations to be performed by at least one of the members.

11 Claims, 9 Drawing Sheets

SHEET SUPPLYING DEVICE HAVING CONTROL UNIT FOR SHEET SUPPLYING OPERATION

BACKGROUND OF INVENTION

The present invention relates to a sheet supplying device for supplying a sheet from a sheet cassette to a sheet feed path of an image forming apparatus such as a copying machine, and more particularly to a sheet supplying device for supplying a developer sheet from a sheet cassette in an image forming apparatus which employs a photosensitive pressure-sensitive recording sheet for carrying a latent image thereon and transferring a developed image to the developer sheet.

There has been recently utilized an image forming apparatus such as a copying machine employing a continuous photosensitive recording medium such as a microcapsule sheet and a developer sheet used in combination with the photosensitive recording medium. In the image forming apparatus as described above, plural developer sheets are stacked in a sheet cassette and are supplied one by one from the sheet cassette by suction means having a suction cup for attracting a sheet to the suction cup under a negative pressure and feeding the attracted sheet through a sheet feed path toward a pressure-developing unit. A sheet supplying device for performing a sheet supplying operation with the suction means is disclosed in detail in Japanese Unexamined Published Patent Application No. 55-93744.

The image forming apparatus using the sheet supplying device as described above is provided with various sensors for detecting operational conditions for performing a series of copying processes. For example, there is a sheet detection sensor for detecting whether the sheet supplied from the sheet cassette is present in a sheet feed path between the sheet cassette and the pressure-developing unit to thereby determine whether a sheet supply error occurs, a photosensor for detecting a light-amount of the halogen lamp 5 of the light source, an uppermost sheet sensor for detecting the uppermost sheet of the developer sheets stacked in the sheet cassette 17 and so on.

The image forming apparatus as described above is further provided with a suction means moving mechanism for mechanically moving the suction means upwardly and downwardly and supplying the developer sheet attached to the suction cup to the sheet feed path every sheet supply operation.

On the other hand, the suction means having a suction cup is required to be mechanically moved upwardly and downwardly to supply a sheet attached to the suction cup to the sheet feed path, and therefore detection of a sheet supply error and a processing for the sheet supply error such as a ceasing operation of the suction means, a ceasing operation of a sheet feed operation of the microcapsule sheet and so on cannot be performed at an early stage after the error is detected. Accordingly, there are cases where the photosensitive pressure-sensitive recording sheet is vainly fed in the sheet feed path and an unnecessary operation is carried out irrespective of occurrence of the error.

In the image forming apparatus thus constructed, when an error such as a sheet supply error, an exposure error or the like occurs in a sheet supply operation of the sheet supplying device as described above, the sheet supplying operation is required to be halfway ceased. In this case, the driving of the suction means moving mechanism is stopped simultaneously with the detection of the error by the sensor, and therefore the following troubles are liable to occur.

Since an operation of moving the suction means by the suction means moving mechanism is ceased at the time when the sheet supply error is detected by the sheet detection sensor, there are possibilities that the suction means are stopped at its descent position and that the suction means are stopped while the sheet is attached to the suction cup. In the former case, when the sheet cassette is removed from the apparatus to remove a sheet in trouble from the sheet feed path, the suction means is abruptly contacted with the sheet cassette and the sheet being removed and is damaged thereby. Further, in the latter case, it is difficult to separate the sheet from the suction cup because the sheet is attached to the suction cup with a vacuum force, and the suction cup is liable to suffer damage when the sheet is forcedly removed from the suction cup. These disadvantages cause durability of the sheet supplying device to be lowered.

Still further, in the image forming apparatus thus constructed, when the sheet supply operation is halfway ceased due to occurrence of an operational error or cut-off of the power supply and the sheet supplied from the sheet cassette is stopped at a position in the sheet feed path where the leading end of the sheet does not reach the sheet detection sensor, the sheet in the sheet feed path cannot be detected by the sheet detection sensor when the sheet supply operation is resumed, and therefore a sheet jam is not detected although the sheet jam actually occurs in the sheet feed path.

SUMMARY OF THE INVENTION

An object of this invention is to provide a sheet supply device having a sheet supply control unit in which when a sheet supplying operation is ceased by detecting an image forming error such as a sheet supply error, an exposure error or other errors, various processing suitable for rapidly resuming the sheet supplying operations can be performed without damaging the sheet supplying device and the other elements of the image forming apparatus.

In order to attain the above object, a sheet supplying device according to this invention for supplying an uppermost sheet of a stack of sheets accommodated in a sheet cassette to a sheet feed path and feeding the sheet along the sheet feed path to perform a sheet supplying operation, the sheet supplying device being used in an image forming apparatus having sensor means for monitoring operational conditions of a series of image forming processes for forming a visible image on the sheet to detect an error of each of the processes and outputting a detection signal indicative of a detection result for each process, comprising suction means movable into and out of contact with the uppermost sheet in the sheet cassette to perform a series of sheet attaching operations, evacuating means for developing a vacuum in the suction means to enable said suction means to attract the uppermost sheet to perform a series of sheet suction operations, moving means for upwardly and downwardly moving the suction means to pick up the sheet from the sheet cassette to perform a series of sheet pick-up operations, sheet feeding means for feeding the sheet from the moving means along the sheet feed path to perform a series of sheet feeding operations, and control means for judging on the basis of the detection signal from the sensor means whether the error occurs during the sheet supplying operation, and when it is judged that the error occurs during the sheet supplying operation, said control means ceases the sheet supplying operation and controls the driving of at least one of the suction means, the evacuating means, moving means and the sheet feeding means so that at least one of the suction means, evacuating means, moving means and sheet feeding means carries out an operation selected from the series of operations to be performed by the at least one means.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE INVENTION

The preferred embodiments of this invention will be described hereunder with reference to the accompanying drawings.

Figure 1:
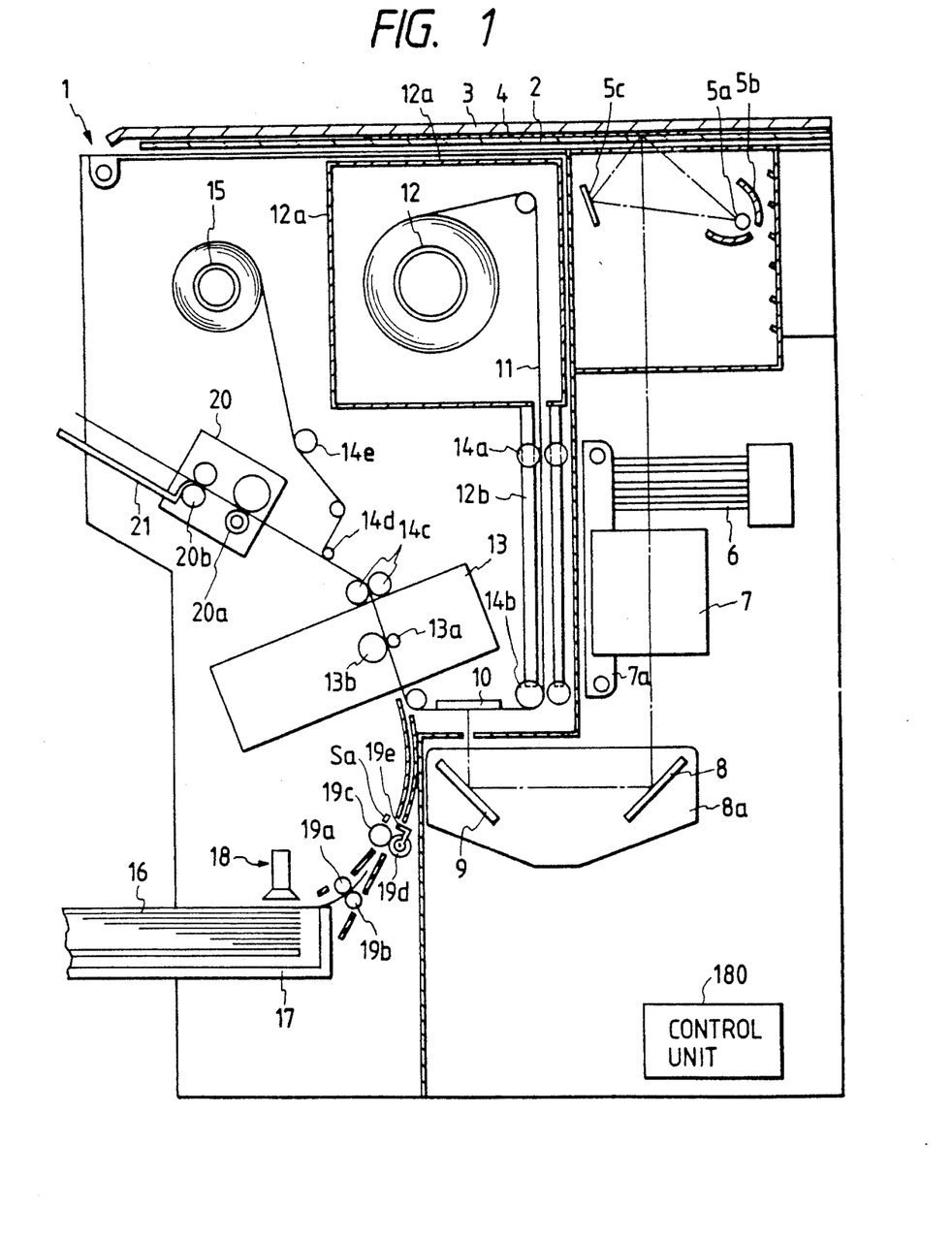
FIG. 1 is a cross-sectional view showing a copying machine incorporating a sheet supplying device according to this invention.

FIG. 1 schematically shows a copying machine incorporating a sheet supplying device according to this invention. The illustrated copying machine, generally indicated at 1, comprises a photosensitive pressure-sensitive copying machine capable of copying full-color images. The copying machine employs a continuous photosensitive pressure-sensitive recording medium 11 such as a photosensitive microcapsule sheet for recording a latent image thereon, and a developer sheet 16 for receiving a developed color image from the microcapsule sheet. The photosensitive microcapsule sheet 11 and the developer sheet 16 are disclosed in U.S. Pat. No. 4,399,209 and Japanese Patent Application Kokai No. 58-88739, for example, and therefore, further description can be neglected.

The copying machine includes an upper panel assembly having an original support stand glass 2 which is movable back and forth and an original support stand glass cover 3 that can be placed over the original support stand glass 2. An original 4 to be copied is put on the original support stand glass 2 which is formed of light transmissive material.

The copying machine 1 also has a light source placed in an upper righthand portion thereof below the original support stand glass 2 and comprising a halogen lamp 5a extending in a direction normal to the direction in which the original support stand glass 2 is movable back and forth, and a semicylindrical reflecting mirror 5b disposed in surrounding relation to the halogen lamp 5a. The light source emits a linear-line light toward the lower surface of the original support stand glass 2.

When the original support stand glass 2 moves, the light emitted from the halogen lamp 5a continuously irradiates the entire surface of the original support stand glass 2 from the lefthand to the righthand end thereof as viewed in FIG. 1. The light from the light source passes through the transparent original support stand glass 2, and is then reflected by the original 4 placed on the original support stand glass 2. The original support stand glass cover 3 covers the entire upper surface of the original support stand glass 2 so that the light applied to the original support stand 2 will not leak from those areas of the original support stand glass 2 which are not covered by the original.

A reflector 5c is positioned on the lefthanded on the side of the light source for applying light emitted from the halogen lamp 5a to the original highly efficiently. The reflector 5b reflects that emitted light which is not directed toward the original support glass 2.

The light reflected from the original on the original support stand glass 2 is directed downwardly and the passes through a filter 6 and a lens 7. The filter 6 serves to pass desired wavelengths of light dependent on the sensitivity of a microcapsule sheet 11 for adjusting the colors of a copied image. The lens 7 is mounted on a lens attachment 7a which is slightly adjustable with respect to the path of the light through the filter 6 and the lens 7.

The light converged by the lens 7 is directed 180 degrees back by two reflecting mirrors 8,9 and then focused on the microcapsule sheet 11 held closely against the lower surface of an exposure table 10. The reflecting mirrors 8,9 are mounted on a mirror attachment 8a which is slightly positionally adjustable to vary the length of the light path and the focused condition.

The microcapsule sheet 11 is of a continuously elongated length and is wound around a cartridge reel 12. The sheet 11 is placed in a removable cartridge 12a positioned below the original support stand glass 2. A leading end portion of the microcapsule sheet 11 extends through many rollers and a pressure developing unit 13 toward a takeup reel 15.

More specifically, the microcapsule sheet 11 drawn out of the cartridge 12a from its lower end is fed and guided by a feed roller 14a and a guide roller 14b, and extends beneath the exposure table 10 into the pressure developing unit 13. The microcapsule sheet 11 which has passed through the pressure developing unit 13 is fed by a pair of feed roller 14c, travels past a separator rollers 14d and an adjustment roller 14e, and is then wound around the takeup reel 15. The microcapsule sheet 11 discharged from the cartridge 12a remains unexposed by a light-shielding cover 12b before the microcapsule sheet 11 reaches the exposure table 10.

The speed at which the microcapsule sheet 11 is fed is controlled so as to be held at a constant level, and remains the same speed at which the original support stand glass 2 is moved. Therefore, a latent image can be formed successively line by line on the microcapsule sheet 11 when it moves past the exposure table 10.

A developer sheet cassette 17 storing a stack of developer sheets 16 is disposed below the pressure developing unit 13. One of the developer sheets 16 is taken out of the cassette 17 by a sheet supplying device 18 which attracts the developer sheet 16 under suction. The developer sheet 16 which is taken from the cassette 17 is delivered by a feed roller 19a and a pinch roller 19b. After the leading end of the developer sheet 16 is aligned by rollers 19c, 19d and a resist gate 19e, the developer sheet 16 is fed into an inlet slot of the pressure developing unit 13. Further, a sheet detection sensor 182 is provided in the sheet feed path between the sheet supplying device 18 and the pressure developing unit 13, and is used to detect whether the developer sheet 16 supplied from the sheet cassette 17 is present or not to thereby determine whether a sheet supply error occurs.

The microcapsule sheet 11 and the developer sheet 16 are closely held against each other when they are introduced into the pressure developing unit 13. The pressure developing unit 13 includes a small diameter roller 13a and a backup roller 13b. The microcapsule sheet 11 and the developer sheet 16 are sandwiched and pressed together between the small diameter roller 13a and the backup roller 13b. At this time, a microcapsule layer on the microcapsule sheet 11 with the latent image formed thereon and a color developer layer on the developer sheet 16 are held against each other. Those microcapsules in the microcapsule layer which are not exposed are ruptured under pressure and a developed image is transferred onto the developer sheet 16.

The microcapsule sheet 11 and the developer sheet 16 which have left the pressure developing unit 13 are fed by the roller 14c. Then, the microcapsule sheet 11 is separated from the developer sheet 16 by the separator roller 14d. The microcapsule sheet 11 is directed upwardly, whereas the developer sheet 16 travels straight ahead into a thermal fixing unit 20. The thermal fixing unit is composed a heater roller 20a and feed roller 20b. After color development on the developer sheet 16 is promoted and the color image is fixed by the heat thermal unit 20, the developer sheet 16 is discharged into a tray 21 with the developed image facing up.

The separated microcapsule sheet 11 travels past the adjustment roller 14e and is wound around the takeup reel 15.

In addition to the above elements, various control units for controlling the driving of the elements are provided to the image forming apparatus, and the operation thereof will be described in detail hereinafter.

The sheet supplying device 18 will be described in greater detail with reference to FIGS. 2 and 3.

The sheet supplying device 18 includes a pair of suction cups 31 mounted on an angularly movable elevator arm 32 by means of an attachment plate 32a. The elevator arm 32 has two pivot shafts 34 (one shown in FIG. 2) rotatably supported on elevator frames 36 which are vertically movably mounted on machine side plates 35 (one of which is shown in FIG. 2). The pivot shafts 34 about which the suction cups 31 are angularly movable have their central axes lying on a plane which contains the suction surfaces of the suction cups 31. The pivot shafts 34 are positioned behind, or upstream of, the position where the suction cups 31 attract the developer sheet 16, with respect to the direction in which the color developer sheet 16 is fed from the cassette 17.

The suction cups 31 are positioned such that they attract the developer sheet 16 at its relatively forward portion in the direction of feed of the developer sheet 16. An uppermost sheet sensor 33 which may comprise a microswitch, for example, is mounted on the elevator arm 32 by means of an attachment plate 32b extending from and inclined at an angle to the attachment plate 32a. When the attachment plate 32b extends vertically, the sensor 33 and the pivot shafts 34 are disposed in a common horizontal plane.

A motor 37 is mounted on one of the frames 36, and a gear 38 rotatable by the motor 37 is also supported on the frame 36. The gear 36 is held in mesh with a swing gear 39 fixed on the pivot shaft 34. Therefore, when the motor 37 is energized, the elevator arm 32 is angularly moved about the pivot shafts 34 in the directions indicated by the arrows A,B (FIG. 3).

Each of the frames 36 is supported by a vertical guide mechanism (not shown), and can be moved vertically in the direction indicated by the arrow C,D, by a stepper motor 40. Shafts 41,42 mounted on the machine side plate 35 extend through respective vertical slots 43,44 defined in the frame 36. Gears 45, 46 fixed to the shafts 41,42, respectively, are held in mesh with racks 47,48 defined on edges of the slots 43,44. A timing belt 51 is trained around pulleys 49, 50 fixed respectively to the shafts 41, 42. A helical gear 52 fixed to the end of the shaft 41 is held in mesh with a worm gear 53 fixed to the output shaft of the stepper motor 40.

Each of the suction cups 31 has an inner hole defined in its bottom and connected through a flexible tube 54 to an evacuating means 55 mounted on the other machine side plate. The evacuating means 55 includes a cylinder 56, a piston 58 having an O-ring 57 and slidably fitted in the cylinder 56, intermeshing gears 59, 60, and a stepper motor 61. When the stepper motor 61 is energized, the gear 60 mounted on the output shaft of the stepper motor 61 causes the gear 59 to rotate about a shaft 62. A pin 63 is disposed on the gear 60 near an outer peripheral surface thereof and fitted in a slot defined in one end of a piston rod 64 joined to move linearly in the cylinder 56 in the direction indicated by the arrow E, thereby developing a vacuum in the cylinder 56 which is connected to the tube 54.

The cylinder 56 has an open end through which the piston rod 64 extends. The open end of the cylinder 56 is preferably directed downwardly so that dust will not be deposited in the cylinder 56 and grease for lubricating the inner surface of the cylinder 56 will not flow through the tube 54 toward the sheets 16. If the open end of the cylinder 56 is directed upwardly, then it should be closed by a cover to prevent foreign matter such as dust and dirt from entering the cylinder 56.

Figure 2:
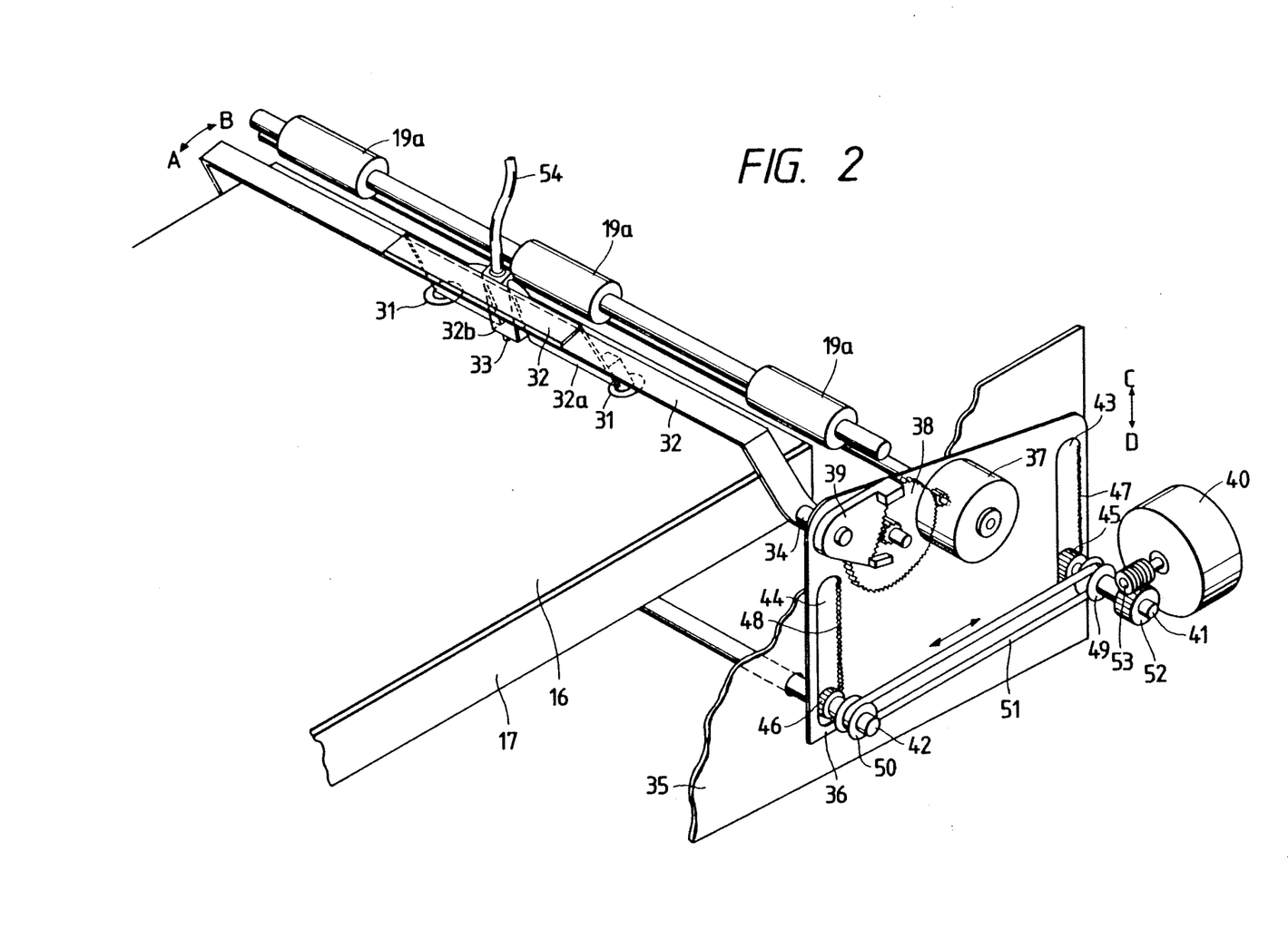
FIG. 2 is a enlarged fragmentary perspective view showing the sheet supplying device.

The feed roller 19a, which is shown as a plurality of feed rollers 19a in FIG. 2, is disposed upwardly of the leading ends of the developer sheets 16 stacked in the cassette 17. The pinch roller 19b is movable toward and away from the feed roller 19a and rotatably supported on the distal ends of swing arm 72 (one shown in FIG. 3) which are angularly movable about a shaft 71 in the directions indicated by the arrow G,H. The swing arm 72 are angularly moved by a pinch roller driving motor such as a stepper motor (not shown) each time a developer sheet 16 is to be fed out of the cassette 17, for thereby moving the pinch roller 19b toward and away from the feed roller 19a. A guide member 73 is disposed downstream of the roller 19a, 19b with respect to the direction of feed of the developer sheets 16, the guide member 73 defining a sheet feed path. The roller 19c, 19d and the resist gate 19e are also disposed downstream of the rollers 19a, 19b. The resist gate 19e includes one end of a lever 74 rotatable about a shaft 73. The roller 19d is supported on the other end of the lever 74. The roller 19d and the resist gate 19e are angularly movable alternatively between the solid-line position and the two-dot-and-dash-line position in FIG. 3.

Operation of the sheet supplying device 18 thus constructed will be described below with reference to FIGS. 2, 3, and 4(a) through 4(d).

It is assumed that the frames 36 are first disposed in a home position. In response to a sheet feed signal from the controller of the copying machine 1, the stepper motor 40 is energized, and its rotation is transmitted through the worm gear 53 and the helical gear 52 to the shaft 41 to rotate the gear 45 in the clockwise direction in FIG. 2. At the same time, the gear 46 on the shaft 42 is rotated in the clockwise direction through the pulley 49, the timing belt 51, and the pulley 50. As the gear 45,46 are in mesh with the respective racks 47,48, the frame 36 is moved downwardly in the direction indicated by the arrow D. Upon the downwardly movement of the frame 36, the attachment platen 32b is its vertical position as shown in FIGS. 3 and 4(a), and the sensor 33 can first detect the uppermost sheet surface in the cassette 17.

When the sensor 33 detects the uppermost sheet surface, the stepper motor 40 is deenergized to stop the downward movement of the frame 36. Then, the stepper motor 37 is energized, and its rotation is transmitted to the gear 38, 39 to rotate the shafts 34 about their own axes. The suction cups 31 are then moved downwardly along an arcuate path until they are held against the uppermost color developer sheet 16 as shown in FIG. 4(b).

Then, the motor 61 is energized to move the piston 58 in the direction indicated by the arrow E. A negative pressure is developed in each of the suction cups 31 to enable the suction cups 31 to attract the uppermost developer sheet 16.

Figure 4A:
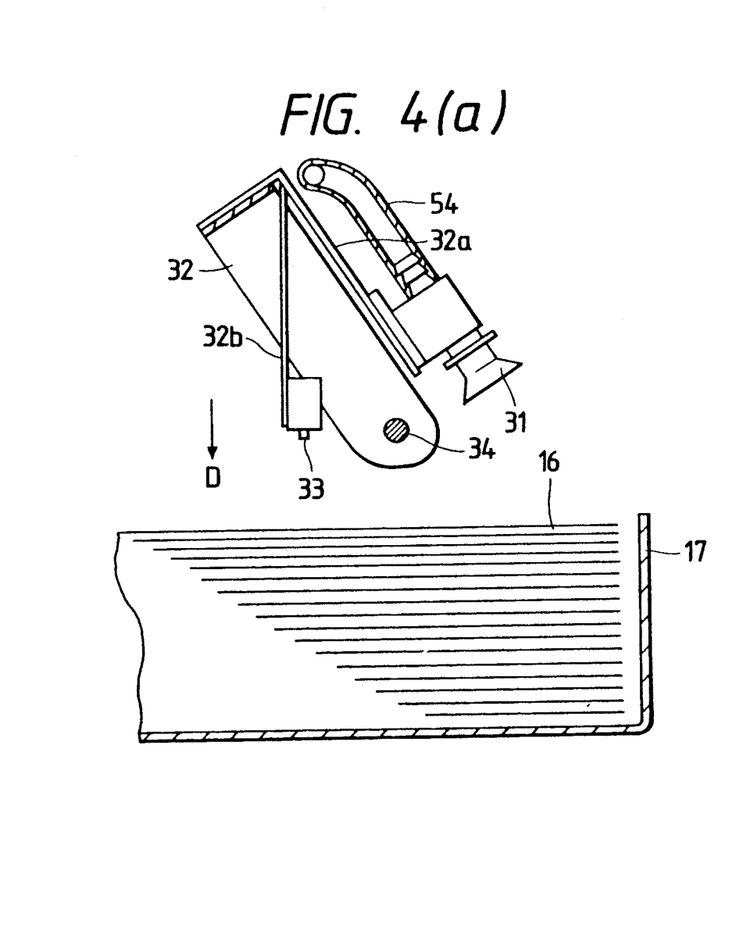
FIGS. 4(a) through 4(d) are sectional side elevational views showing a series of sheet supplying operations of the sheet supplying device as shown in FIG. 2.
Figure 4B:
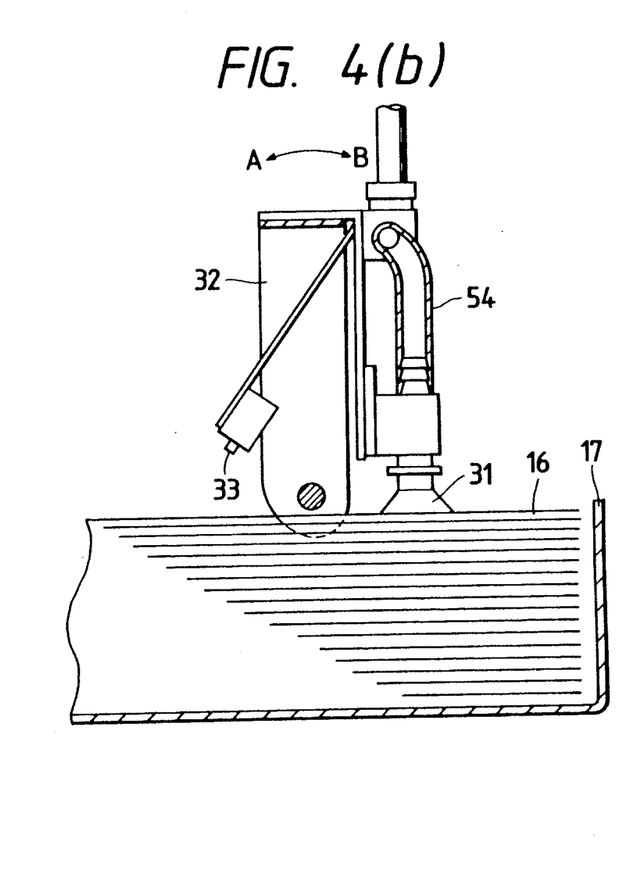
Figure 4C:
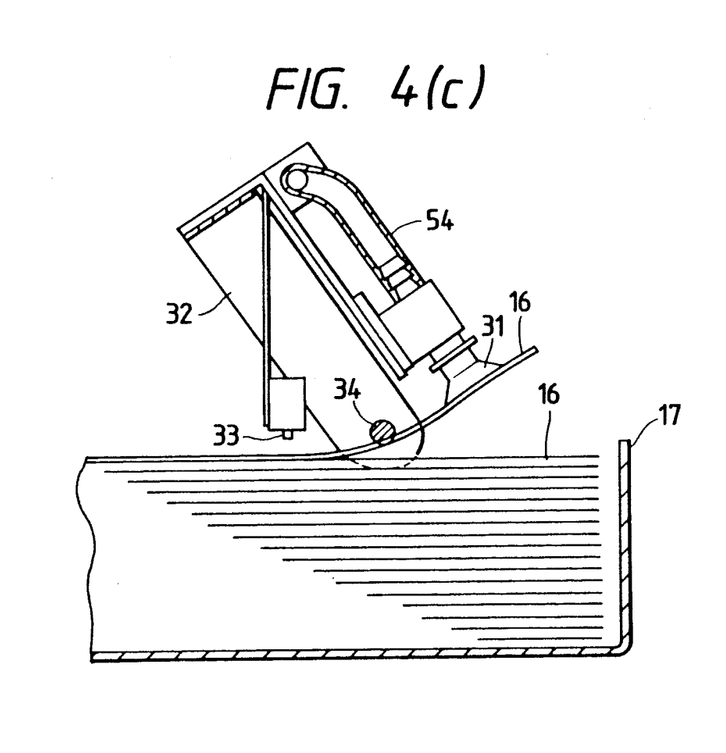

With the suction cups 31 attracting the uppermost developer sheet 16, the stepper motor 37 is reversed to turn the arm 32 through a predetermined angle about the shaft 34 in the direction indicated by the arrow A until the arm 32 assumes the position shown in FIG. 4(c). At this time, the arm 32 is not turned about the suction cups 31, but is turned about the shafts 34 positioned behind the suction cups 31. Therefore, the suction cups 31 also turned about the shafts 34. The suction cups 31 attract the uppermost developer sheet 16 under suction and lift the leading end position of the developer sheet 16 off the next developer sheet 16. At this time, the uppermost developer sheet 16 is separated from the lower sheet 16 because of the stiffness of the upper developer sheet 16. Even if the negative pressure developed in the suction cups 31 is relatively small in pressure, the suction cups 31 can separate the upper most sheet 16 since it is simply lifted off the lower developer sheet 16 without frictional engagement therewith. If the suction cups 31 were not turned but were operated only to attract the developer sheet 16, two or more developer sheets would be fed out at the same time when an electrostatic force acting on these sheets is greater than the weight of the developer sheet 16. Since the suction cups 31 are actually turned about the shafts 34, however, two or more developer sheets are prevented from being fed out together. An experiment conducted on the sheet supplying device 18 indicated that the uppermost sheet 16 could sufficiently be separated from the lower developer sheet 16 by the suction cups 31 when the arm 32 was turned through about 30 degrees. After the uppermost developer sheet 16 has been separated, the stepper motor 40 is reversed to elevate the frames 36 and hence the elevator arm 32 in the direction indicated by the arrow C up to the position shown in FIG. 4(d) in which the leading end of the developer sheet 16 is positioned directly below the feed roller 19a.

Figure 4D:
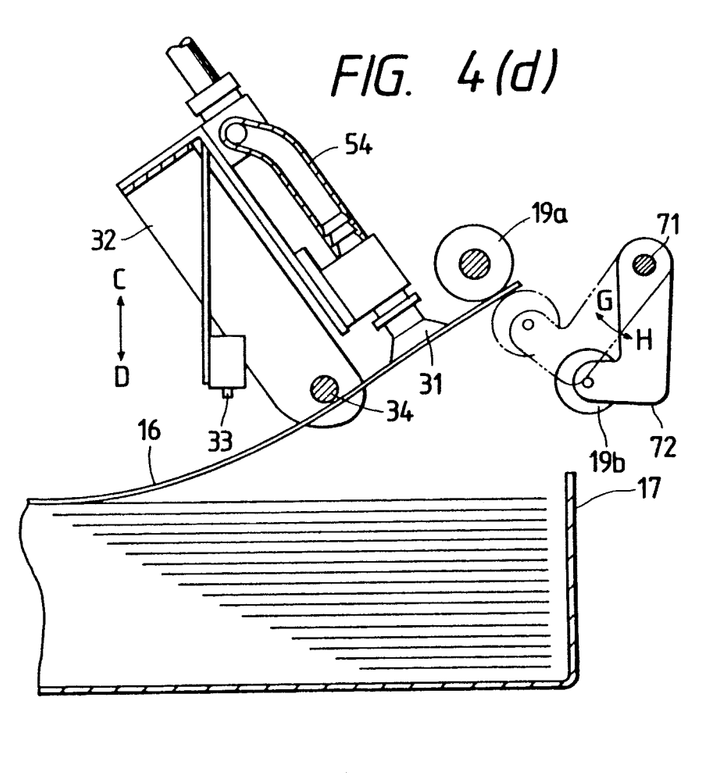

Then, the pinch roller 19b is swung about its own axis in the direction indicated by the arrow G to pinch or nip the leading end of the developer sheet 16 between the pinch roller 19b (indicated by the two-dot-and-dash line) and feed roller 19a. Thereafter, the motor 61 of the evacuating means 55 is reversed to move the piston 58 in the direction of the arrow F. The vacuum in the suction cups 31 is eliminated, and the developer sheet 16 is released from the suction cups 31.

The stepper motor 40 is further energized to lift the frames 36 and the arm 32 by a certain distance to avoid engagement or interference between the suction cups 31 and the developer sheet 16 it is fed along.

Through the above operation, the uppermost one of the stacked developer sheets 16 is separated and delivered into the sheet feed path. In an initial stage of the sheet supplying operation, the roller 19d and the resist gate 19e are in the two-dot-and-dash position shown in FIG. 3, and hence the rollers 19c, 19d are spaced from each other. The developer sheet 16 is fed by the feed roller 19a and the pinch roller 19b until its leading end is engaged by the resist gate 19e, whereupon the leading end of the developer sheet 16 is properly aligned and corrected from any skewed condition. Then, the lever 74 is turned to displace the roller 19d against the roller 19c and pull the resist gate 19e out of the sheet feed path. The developer sheet 16 is now fed along the sheet feed path toward the pressure-developing unit.

Figure 5:
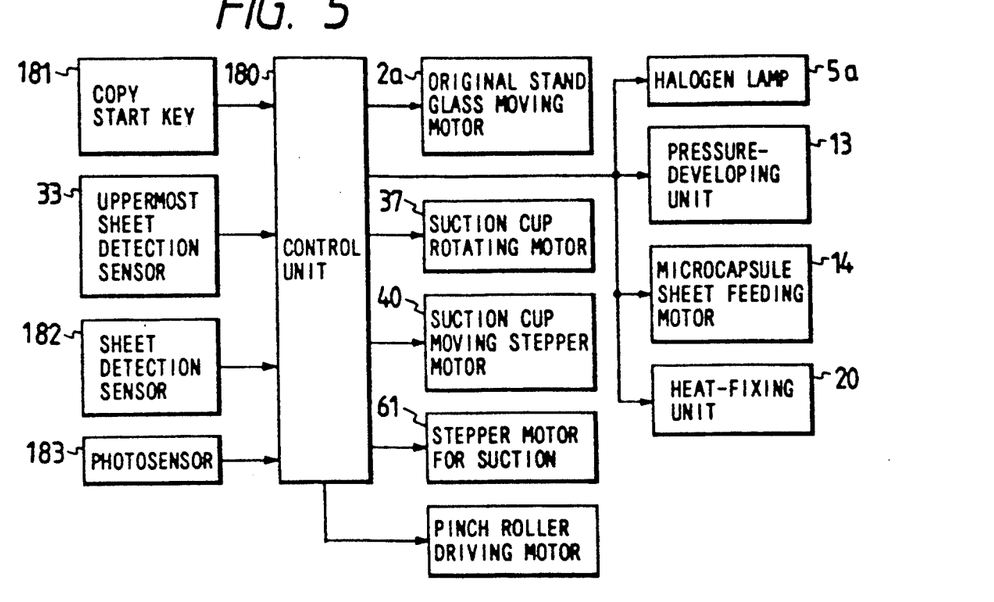
FIG. 5 is a block diagram of a control system used for the sheet supplying device as shown in FIG. 2.

FIG. 5 is a block diagram showing an embodiment of a control system for performing an operation for controlling the sheet supplying device 18 of this invention when a sheet supply error, an exposure error and other errors occur in a sheet supplying operation and are detected by the sheet detection sensor and other sensors.

The control system according to this invention is constructed so that when a sheet supplying operation is ceased by detecting a sheet supply error, an exposure error or other errors, various processings suitable for rapidly resuming the sheet supplying operation without damaging the sheet supplying device and the other elements of the image forming apparatus can be carried out with accuracy.

As shown in FIG. 5, the control system includes a control unit 180 such as a microcomputer including a CPU for performing a series of processings for the above control operation, a ROM, a RAM and other elements such as an input interface and an output interface. The control unit 180 is connected to a copy start key 181 on an operational panel and various sensors such as the upper most sheet sensor 33, the sheet detection sensor 182, a photosensor 183 for detecting an amount of light of the light source, and so on, and is supplied with detection signals from those elements through the input interface. In accordance with those detection signals, the control unit 180 controls the driving of a original stand glass moving motor 2a, the halogen lamp 5, the pressure-developing unit 13, a sheet feeding motor 14 for feeding the microcapsule sheet 11, the heat-fixing unit 20, the stepper motors 37, 40 and the pinch roller driving motor, and so on at a predetermined timing.

An embodiment of the operation to be performed by the control unit as shown in FIG. 5 will be described hereunder.

The suction cups 31, that is, the elevator frames 36 are disposed at its uppermost position (home position) at an initial stage or a stand-by stage. On the other hand, the suction cups 31 and the elevator frames 36 are moved downwardly and upwardly by driving the stepper motor 40 by a prescribed amount every copying operation, thereby performing the sheet supplying operation. In this sheet supplying operation, the control unit 180 monitors each of the sensors to detect occurrence of errors such as a sheet supply error, an exposure error that a light-amount of the halogen lamp Sa is not kept to a predetermined value. If the occurrence of the error is detected by the control unit 180, the control unit 180 drives the stepper motor 40 to upwardly move the suction cups (that is, the elevator frames) to the home position (uppermost position) and then ceases the driving of the stepper motor 40, or immediately ceases the driving of the stepper motor 40 if the suction cups and the elevator frames have been already positioned at the home position.

Figure 6:
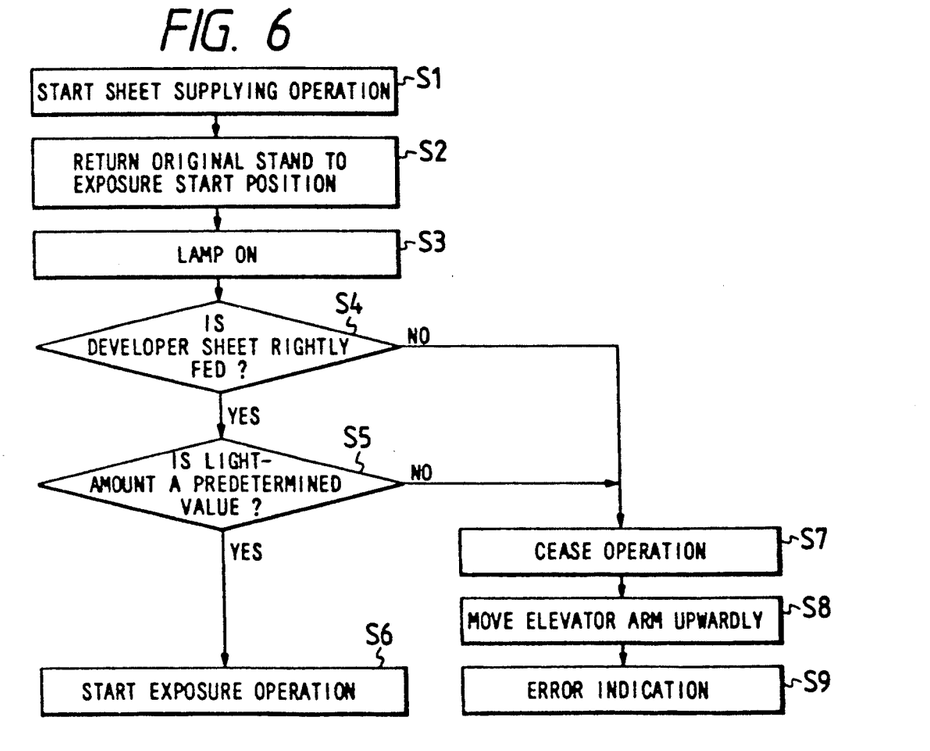
FIG. 6 is a flowchart for a control operation of the control system as shown in FIG. 5.

The above operation will be described in detail, particularly in a case where the sheet supplying error and the exposure error are detected by the control unit 180, with reference to the flowchart as shown in FIG. 6.

The sheet supplying device 18 is actuated by switching the copy start key 181 to an ON-state to commence a sheet supplying operation of the developer sheet 16 from the sheet cassette 17 (in a step S1). The original stand glass moving motor 2a is driven to move the original stand glass 2 to an initial position for the exposure process. Thereafter, the halogen lamp Sa is switched to the ON-state (in steps S2 and S3), and then the control unit 180 is supplied with detection signals from the sheet detection sensor 182 and the photosensor 183. The control unit 180 judges from the detection signals whether the developer sheet 16 is rightly fed in the sheet feed path and whether the light-amount of the halogen lamp 5a is a predetermined value (in steps S4 and S5). If it is judged that the developer sheet 16 is rightly fed in the sheet feed path and the halogen lamp 5a has the predetermined amount of light, the exposure process is commenced (in a step S6) and the subsequent copying processes are carried out. On the other hand, if it is judged that the developer sheet 16 is not rightly fed in the sheet feed path, or the light-amount of the halogen lamp 5a is not the predetermined value, the control unit 180 ceases the operation of the sheet supplying device 18 (in a step S7). Thereafter, the control unit 180 drives the stepper motor 40 to upwardly move the suction cups 31 (the elevator frames) to the home position (in a step S8), and indicates an error on a display (in a step S9).

As described above, even though the sheet supply error or the exposure error occurs in the sheet supplying operation and the sheet supplying operation is halfway ceased, the suction cups 31 and the elevator frames 36 can be prevented from stopping at the lowermost position thereof. Accordingly, even when the sheet cassette 17 is removed from the image recording apparatus to remove the sheet in trouble in the sheet feed path due to the sheet supply error, exposure error or the other errors, the sheet cassette 17 can be prevented from abutting against the sheet supplying device including the suction cups and the elevator frames, so that the sheet supplying device 18 can be prevented from being damaged. Accordingly, the durability of the sheet supplying device can be improved and the sheet supply error and the other errors can be easily and rapidly removed.

The above effect of this invention is additionally improved if the following control operations are used independently or in combination with the above and other control operations.

(1) When a sheet supply error, an exposure error or the like occurs, the control unit 180 drives the stepper motors 37 and 40 to return the arm 32 to the position where the arm 32 is disposed at a time just before the suction operation by the suction cups starts, and drives the motor 61 of the evacuating means 55 in a reverse direction to move the piston 58 in a direction shown by arrow F so that the suction operation of the suction cups 31 is ceased to thereby naturally release the developer sheet 16 from the suction cups 31 and return the released developer sheet to the sheet cassette 17. Accordingly, the above control operation can overcome the disadvantage of the conventional sheet supplying device that it is difficult to remove the developer sheet 16 which has been attached to the suction cups 31 under vacuum because a certain error occurs in the sheet supplying operation.

Figure 7:
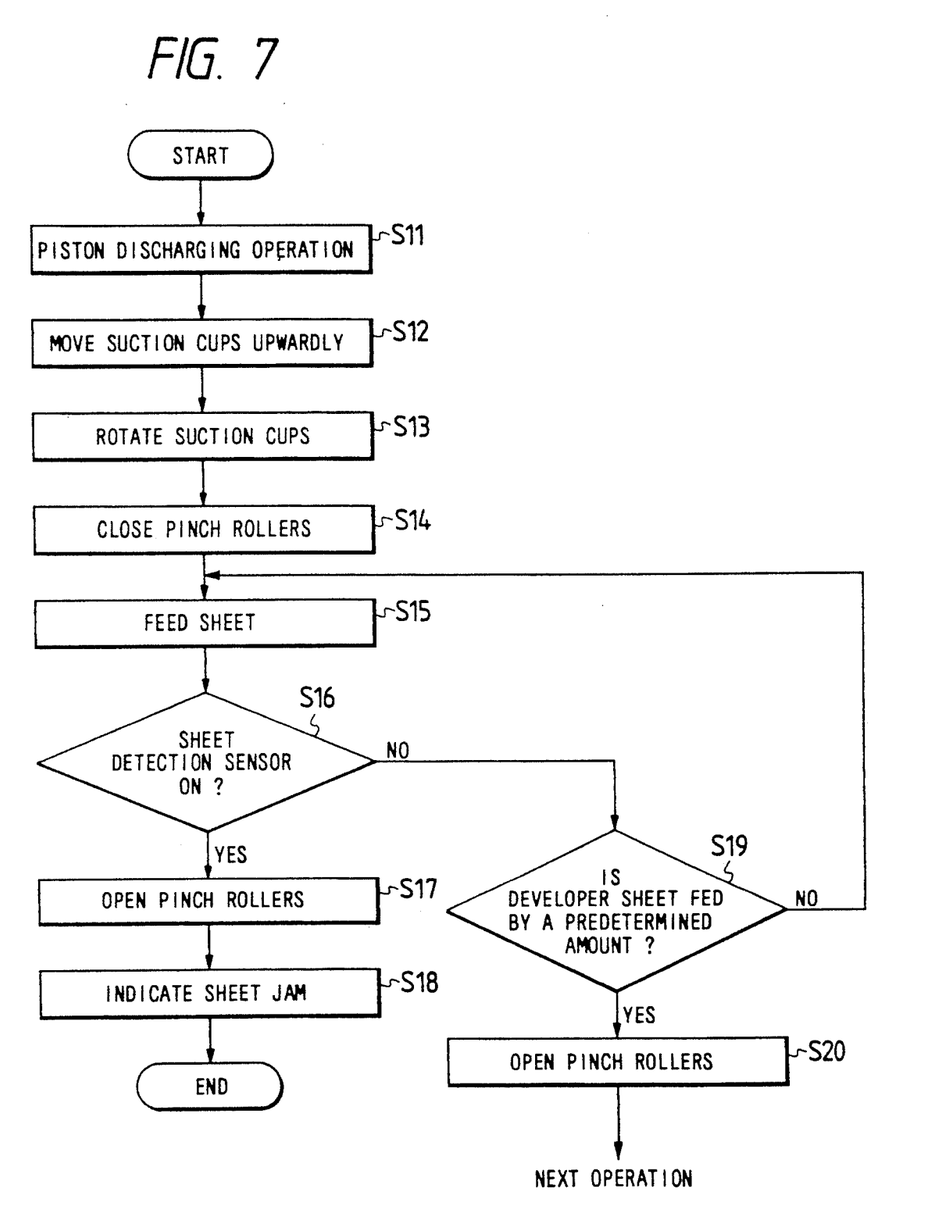
FIG. 7 is a flowchart for another control operation of the control system as shown in FIG. 5.

(2) FIG. 7 is a flowchart for a control operation of indicating a sheet-jam at an early stage of the sheet supplying operation. According to the flowchart as shown in FIG. 7, when a power supply is carried out or a sheet supply error occurs, the piston 58 is moved int he direction shown by arrow F in FIG. 3 to forcedly release the attached developer sheet 16 from the suction cups 31 (in a step S11). Therafter, the suction cups 31 are upwardly moved by the stepper motor 40 (in a step S12), and the motor 37 is rotated to move the suction cups 31 away from the sheet feed path (in a step S13). The pinch roller 19b is contacted with the pinch roller 19a under pressure by the pinch roller driving motor in consideration into a possibility that the developer sheet is erroneously left in the sheet feed path (in a step S14), and then those rollers 19a and 19b are rotated to carry out a sheeting operation by a predetermined sheet feeding amount (in a step S15). During the sheet feeding operation in the step S15, a detection signal from the sheet detection sensor 182 is monitored (in a step S16). If the detection signal indicative of the presence of the developer sheet 16 in the sheet feed path is detected by the sheet detection sensor 182, the sheet feeding operation is ceased, the pinch rollers 19a and 19b are opened (in a step S17) by the pinch roller driving motor and a sheet-jam is indicated on a display (not shown) (in a step S18). On the other hand, if the presence of the developer sheet 16 in the sheet feed path is not detected by the sheet detection sensor 182 even after the sheet feeding operation is carried out by the predetermined sheet feeding amount, it is judged that the developer sheet 16 is not present in the sheet feed path (in a step S19). In this case, the pinch rollers 19a and 19b are opened and then a subsequent operation is carried out. The predetermined sheet feeding amount is set so that the developer sheet 16 is fed in the sheet feed path by a distance longer than a distance between the pinch roller 19a (19b) and the sheet detection sensor 182.

As described above, according to this control operation of the control unit 180 of this embodiment, the sheet feeding operation of the developer sheet is carried out before a next sheet supplying operation is performed, and a sheet-jam error is indicated on the display when the developer sheet is erroneously left in the sheet feed path, the next sheet supplying operation is accurately carried out without sheet jam and an image having high quality is obtained.

The above description is made for the sheet supplying operation of the sheet supplying device used in a copying machine employing the microcapsule sheet 11, particularly in a case where the sheet supply error or exposure error occurs and is detected by the sheet detection sensor and the photosensor. However, the sheet supplying device of the above embodiment can be applied to another type image forming machine such as a printer, and the control system of this invention can be also used to the other error detection systems than the detection systems of the sheet supply and exposure errors as described above. For example, a suction error sensor for detecting a suction error of the suction means may be provided to the sheet supplying device 18. In this case, in a state as shown in FIG. 4(d), the control unit 180 inspects a detection signal from the uppermost sheet sensor 33, and judges from the detection signal whether or not the developer sheet 16 is attached to the suction cups 31, that is, whether a suction error occurs. If the control unit 180 judges the suction error, the control unit 180 repeats the sheet supplying operation from a state as shown in FIG. 4(a).

According to the above control operation, it is beforehand judged at an early stage of the sheet supplying operation whether the suction operation of attaching the developer sheet to the suction cups 31 by the suction means succeeds, and the suction operation is immediately repeated if it is judged that the suction error occurs. Accordingly, even though the suction error is detected, the sheet supplying operation is not necessarily ceased and therefore a time loss for resuming the sheet supplying operation and the other operations is reduced.

Figure 3:
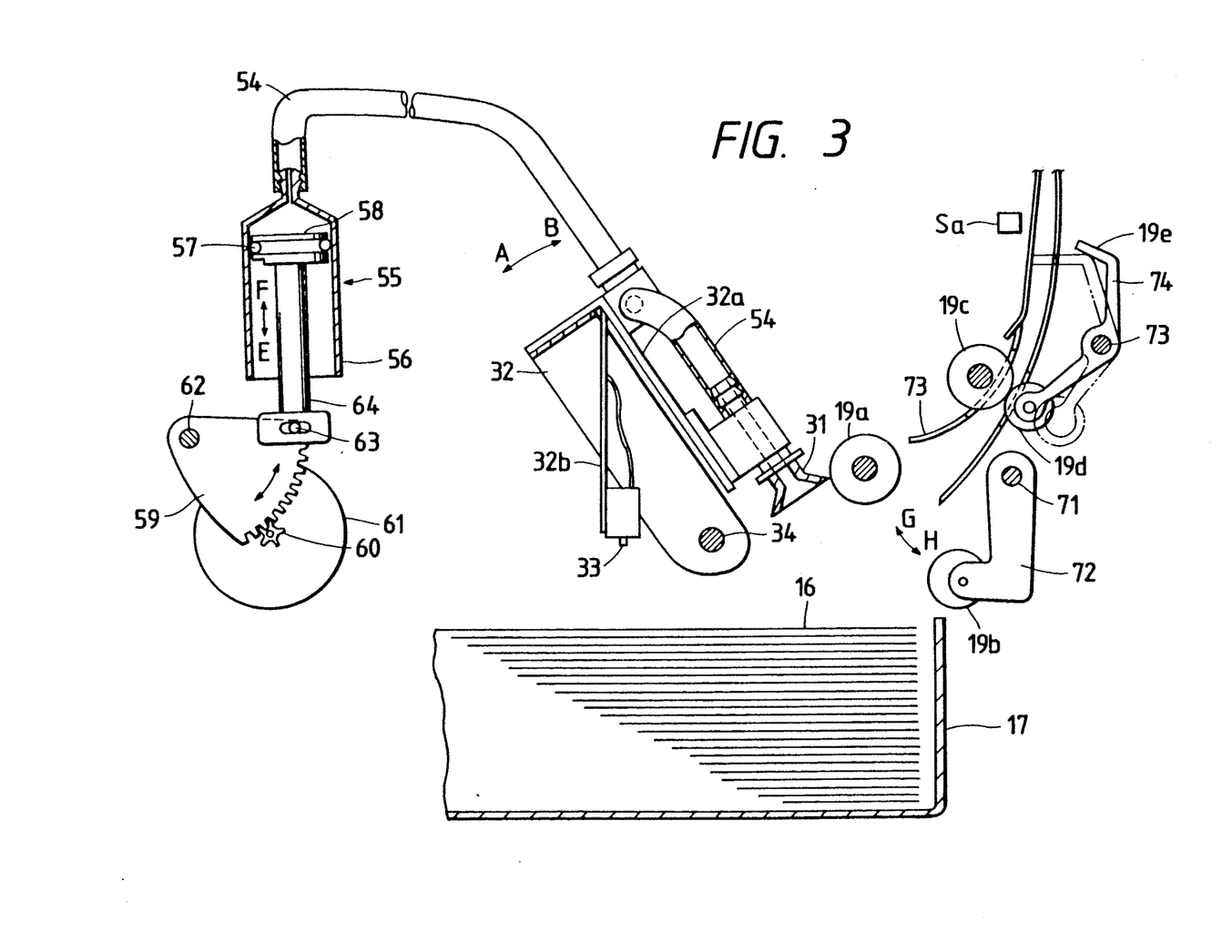
FIG. 3 is a side elevational view, partly cut away, showing the sheet supply mechanism of the sheet supplying device as shown in FIG. 2.
Figure 8:
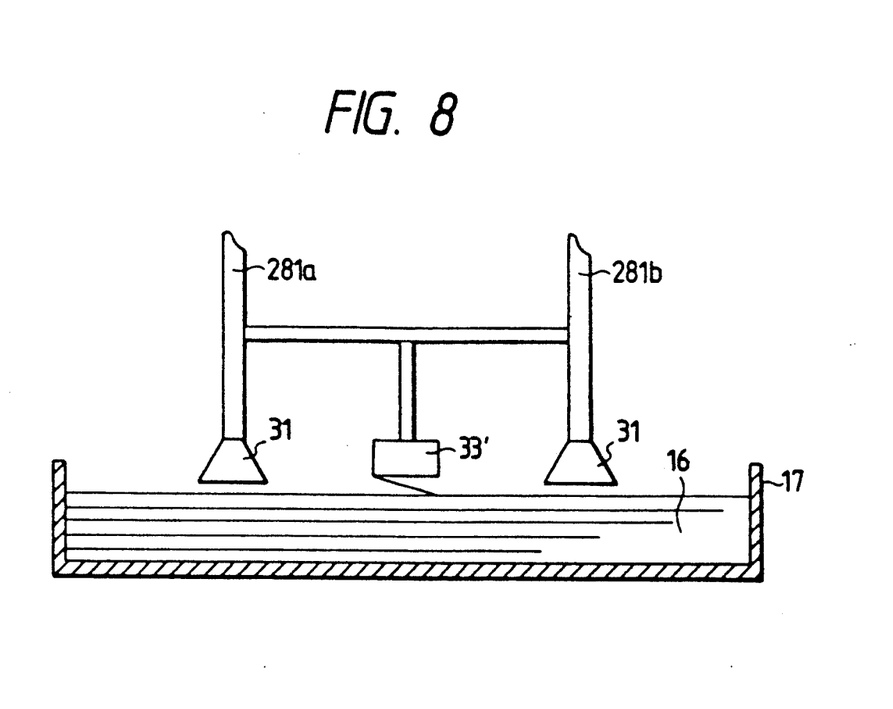
FIG. 8 is a side view of another embodiment of the sheet supplying device as shown in FIG. 2.

In place of the sensor 33 serving as a suction error sensor as shown in FIGS. 2-4, a sensor 33' as shown in FIG. 8, serving as the suction error, may be used. The sensor 33' is supported between supporting members 281a and 281b serving as a suction means moving means for supporting the suction cups 31 and moving the suction cups 31 upwardly and downwardly. With the construction of the suction means moving means as shown in FIG. 8, the suction error can be accurately detected by the sensor 33' without rotating the suction cups 31.

As a sheet supplying device capable of detecting a residual quantity of the sheets remaining in the sheet cassette, there has been a sheet supplying device having a sheet-residue detection mechanism in which the developer sheets stacked in the sheet cassette are upwardly moved with a upwardly-urging unit such as a spring member. In this detection means, an urging force of the upwardly-urging unit is changed in accordance with an amount of the sheets which have been removed from the stack of the sheets due to the sheet supplying operation, and therefore the residual quantity of the sheets remaining in the sheet cassette is detected by monitoring the change of the urging force of the upwardly-urging unit.

On the other hand, in the embodiments of the sheet supplying device as described above, plural developer sheets 16 are stacked in the sheet cassette 17 and the suction means picks up an uppermost sheet of the stacked developer sheets 16 successively. In this type of sheet supplying device, a sheet supplying operation is carried out while a stack of the sheets in the sheet cassette are not moved (for example, vertically) and only an uppermost sheet is vertically moved by the movement of the suction means. Accordingly, the upwardly-urging unit as described above cannot be applied to the embodiments of the sheet supplying device of this invention. However, with a control operation of the following control system, the sheet supplying device of this invention can simply detect the residual quantity of the sheets remaining in the sheet cassette without a mechanism such as an upwardly-urging unit.

In this embodiment, the uppermost sheet sensor 33 is used as not only a detection means for detecting an uppermost sheet, but also a sheet-residue detection means for detecting an residual quantity of the sheets remaining in the sheet cassette. Further, in addition to the elements as shown in FIG. 5, a copy frequency setting key 280, a counter 82 for counting a pulse number for driving the stepper motor 40 and a display unit 283 for indicating a residual quantity of the developer sheets remaining in the sheet cassette and a sheet-shortage of the developer sheets in a successive copying operation are further provided to the control system as shown in FIG. 9.

Figure 9:
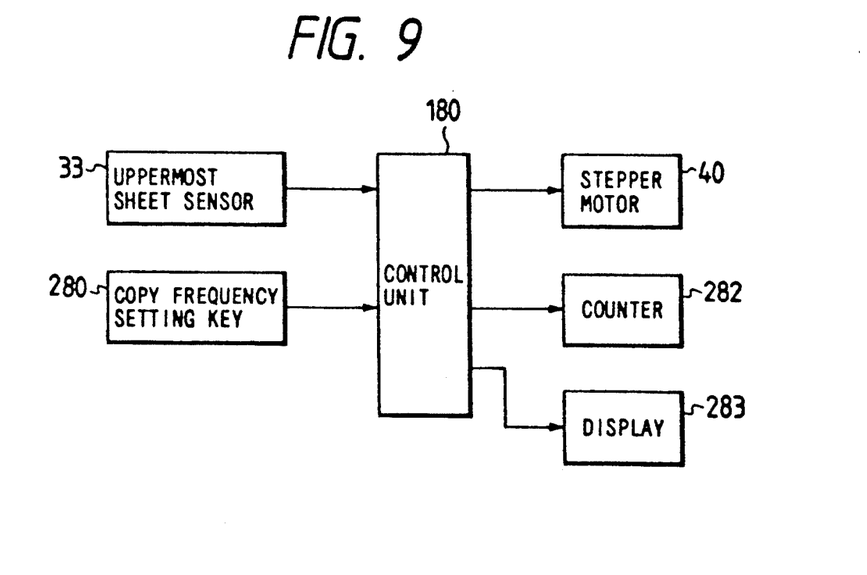
FIG. 9 is a block diagram of another control system used for the sheet supplying device according to this invention.

In the additional elements of the control system as shown in FIG. 9, when the sensor 33 detects the uppermost sheet in the sheet cassette, the control unit 180 ceases the rotation of the stepper motor 40 and stops the descending movement of the frames 36. In this case, the pulse number for driving the stepper motor 40 is counted by the counter 82, so that the pulse number at the instantaneous time when the sensor 33 detects the uppermost sheet can be known.

Figure 10:
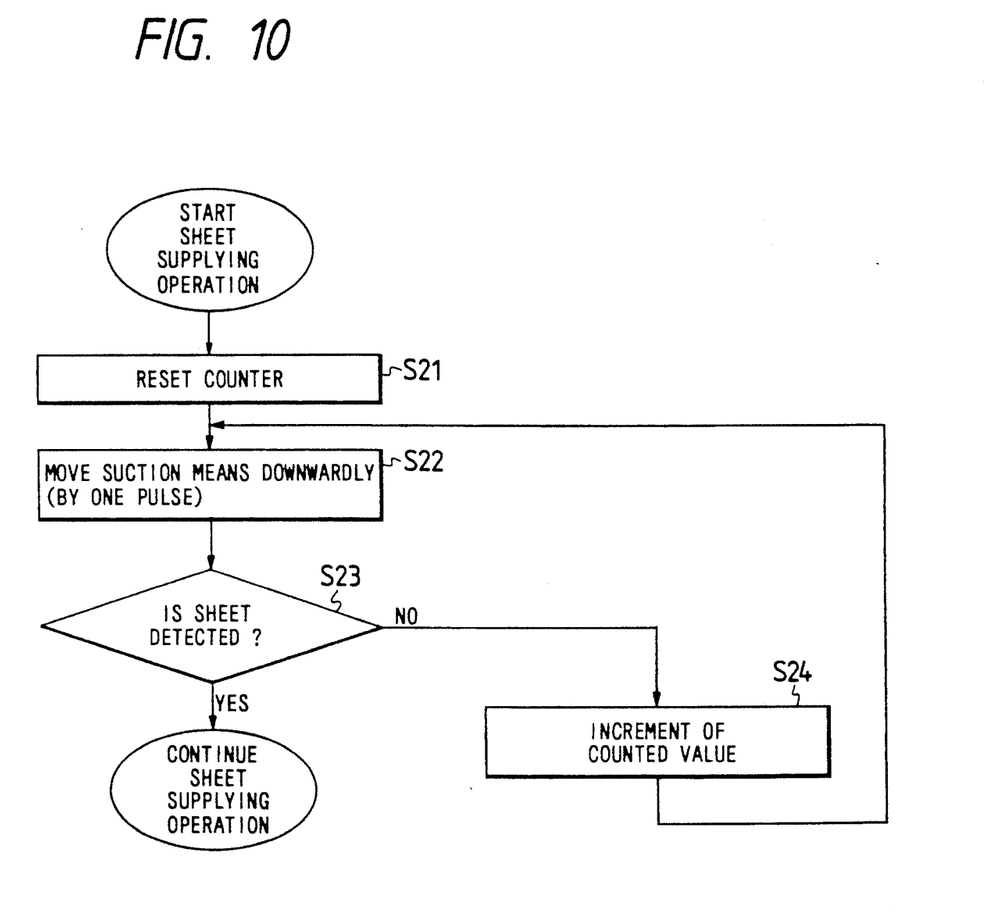
FIG. 10 is a flowchart for a control operation of the control system as shown in FIG. 9.

The control operation of the additional elements of the control system as shown in FIG. 9 will be described with reference to a flowchart of FIG. 10.

When a sheet supplying operation starts, the stepper motor 40 is driven to downwardly moving the suction means having the suction cups 31. In this case, immediately before the driving of the stepper motor 40, the control unit 180 resets the counter 282 to make a countered value of the counter 282 clear (in a step S1), and then drives the stepper motor 40 by one step to downwardly move the suction means by a little amount (in a step S22) and judges on the basis of a detection signal from the sensor 33 whether the uppermost sheet is present or not (in a step S23). If the sensor 33, that is, the control unit 180 does not detect the uppermost sheet, the control unit 180 controls the counter 282 to increase its counted value by one (in a step S24) and goes to the step S22. Those operations are repeated until the uppermost sheet is detected. If the uppermost sheet is detected, the control unit 180 ceases the driving of the stepper motor 40 and goes to a next step for the sheet supplying operation.

The residual quantity of the sheets remaining in the sheet cassette is determined on the counted value of the counter 282 in the following manner.

Assuming that X represents the residual quantity of the sheets in the sheet cassette; A, a counted pulse number for driving the stepper motor to downwardly move the suction means from a predetermined position until the residual quantity of the sheets becomes zero; B, a counted pulse number for driving the stepper motor to downwardly move the suction means from the predetermined position until the sensor 33 detects the uppermost sheet; and a, a proportional constant which is determined in accordance with a thickness of the sheet, the following equation is satisfied:

$$X = a(A - B)$$

Accordingly, the residual quantity of the sheets (X) is calculated from the above equation. On the basis of the calculated residual quantity of the sheets, an indication of the residual quantity of the sheets is made on the display unit 283, or if the copy frequency (number of times) set by the key 280 is larger than that obtained by the above equation, an indication for advising an operator to supply sheets to the sheet cassette is made with lighting of a lamp.

In the above embodiment, the counter is used to measure a moving distance of the suction means. However, a measuring unit is not limited to the counter.

As described above, even though an image forming error such as a sheet supply error, an exposure error and so on occurs during the sheet supplying operation, the sheet supplying operation of the sheet supply device is controlled so that a resumption of the sheet supplying operation is smoothly and accurately carried out with no damage of the sheet supplying device, the developer sheets and the other elements, thereby forming an image of high equality.

What is claimed is:

1. A sheet supplying device for supplying an uppermost sheet of a stack of sheets accommodated in a sheet cassette to a sheet feed path and feeding the sheet along the sheet feed path to perform a sheet supplying operation, said sheet supplying device being used in an image forming apparatus having sensor means for monitoring operational conditions of a series of image forming processes for forming a visible image on the sheet to detect an error of each of the processes and outputting a detection signal indicative of a detection result for each process, comprising:

suction means movable between uppermost and lowermost positions into and out of contact with the uppermost sheet in the sheet cassette to perform a series of sheet attaching operations;

evacuating means for developing a negative pressure in said suction means to enable said suction means to attract the uppermost sheet to perform a series of sheet suction operations;

moving means for upwardly and downwardly moving said suction means to pick up the sheet from the sheet cassette to perform a series of sheet pick-up operations;

sheet feeding means for feeding the sheet from said moving means along the sheet feed path to perform a series of sheet feeding operations; and control means for judging on the basis of the detection signal from the sensor means whether an error occurs during the sheet supplying operation, and when it is judged that the error occurs during the sheet supplying operation, said control means ceasing the sheet supplying operation and controlling the driving of at least one of said suction means, said evacuating means, moving means and said sheet feeding means so that at least one of said suction means, evacuating means, moving means and sheet feeding means carries out an operation selected from a series of operations to be performed by said at least one of said suction means, evacuating means, moving means and sheet feeding means, wherein when judging that the error occurs during the sheet supplying operation, said control means controls said moving means to upwardly move said suction means and stop said suction means at a position spaced away from the sheet cassette.

2. A sheet supplying device as claimed in claim 1, wherein the position is the uppermost position of said suction means.

3. A sheet supplying device as claimed in claim 1, wherein when judging that the error occurs during the sheet supplying operation, said control means controls said evacuating means to cease a vacuum-developing operation of said evacuation means, so that the sheet is released from said suction means to the sheet cassette.

4. A sheet supplying device as claimed in claim 1, wherein said sensor means includes sheet detection means provided in the sheet feed path for detecting whether the sheet is present or not in the sheet feed path and outputting a detection signal indicative of a detection result.

5. A sheet supplying device as claimed in claim 4, wherein when judging that the error occurs during the sheet supplying operation, said control means controls said sheet feeding means to carry out a series of sheet feeding operations before the sheet supplying operation is resumed, and then judges on the basis of the detection signal from said sheet detection signal whether the sheet is present or not in the sheet feed path.

6. A sheet supplying device as claimed in claim 5, wherein said control means resumes the sheet supplying operation if it is judged that the sheet is not present in the sheet feed path, and making an indication that the sheet feed error occurs.

7. A sheet supplying device as claimed in claim 1, wherein said sensor means includes an uppermost sheet detection sensor for detecting an uppermost sheet of a stack of the sheets in the sheet cassette.

8. A sheet supplying device as claimed in claim 7, wherein said uppermost detection sensor detects whether the sheet is normally attached to said suction means and outputs a detection signal indicative of a detection result, and when judging on the basis of the detection signal from said uppermost detection sensor that the sheet is not normally attached to said suction means, said control means recommences the sheet supplying operation.

9. A sheet supplying device as claimed in claim 1, wherein said control means includes sheet-residue detection means for detecting a residual quantity of the sheets remaining in the sheet cassette.

10. A sheet supplying device for supplying an uppermost sheet of a stack of sheets accommodated in a sheet cassette to a sheet feed path and feeding the sheet along the sheet feed path to perform a sheet supplying operation, said sheet supplying device being used in an image forming apparatus having sensor means for monitoring operational conditions of a series of image forming processes for forming a visible image on the sheet to detect an error of each of the processes and outputting a detection signal indicative of a detection result for each process, comprising:

suction means movable between uppermost and lowermost positions into and out of contact with the uppermost sheet in the sheet cassette to perform a series of sheet attaching operations;

evacuating means for developing a negative pressure in said suction means to enable said suction means to attract the uppermost sheet to perform a series of sheet suction operations;

moving means for upwardly and downwardly moving said suction means to pick up the sheet from the sheet cassette to perform a series of sheet pick-up operations;

sheet feeding means for feeding the sheet from said moving means along the sheet feed path to perform a series of sheet feeding operations; and control means for judging on the basis of the detection signal from the sensor means whether an error occurs during the sheet supplying operation, and when it is judged that the error occurs during the sheet supplying operation, said control means ceasing the sheet supplying operation and controlling the driving of at least one of said suction means, said evacuating means, moving means and said sheet feeding means so that at least one of said suction means, evacuating means, moving means and sheet feeding means carries out an operation selected from a series of operations to be performed by said at least one of said suction means, evacuating means, moving means and sheet feeding means, wherein said control means includes sheet-residue detection means for detecting a residual quantity of the sheets remaining in the sheet cassette, said sheet-residue detection means comprising an uppermost sheet detection sensor for detecting an uppermost sheet of a stack of the sheets in the sheet cassette and outputting a sheet detection signal when detecting the uppermost sheet, and measuring means for measuring a moving distance of said suction means on the bases of the detection signal from said uppermost sheet detection means.

11. A sheet supplying device as claimed in claim 10, wherein said moving means comprises a stepper motor for upwardly and downwardly moving said suction means, wherein said measuring means comprises a counter for counting the number of pulses to be applied to said stepper motor until said uppermost sheet detection sensor detects the uppermost sheet, to thereby determine the moving distance of said suction means on the basis of the counted pulse number, and wherein said control means calculates the residual quantity of the sheets in the sheet cassette on the basis of the moving distance.

* * * * *